United States Patent [19]

Chiang

[11] Patent Number: 5,097,208
[45] Date of Patent: Mar. 17, 1992

[54] APPARATUS AND METHOD FOR MEASURING GATE DELAYS IN INTEGRATED CIRCUIT WAFERS

[75] Inventor: David Chiang, Saratoga, Calif.

[73] Assignee: Altera Corporation, San Jose, Calif.

[21] Appl. No.: 622,615

[22] Filed: Dec. 5, 1990

[51] Int. Cl.⁵ .............................................. G01R 25/00
[52] U.S. Cl. .............................. 324/158 R; 324/73.1; 324/83 D; 324/617
[58] Field of Search ................ 324/158 R, 73.1, 83 D, 324/79 D, 617; 437/8; 307/352

[56] References Cited

U.S. PATENT DOCUMENTS

| | | | |
|---|---|---|---|
| 2,851,596 | 9/1958 | Hilton | 324/83 D |
| 3,681,693 | 8/1972 | Hseh | 324/83 D |
| 4,712,061 | 12/1987 | Lach | 324/83 D |
| 4,782,283 | 11/1988 | Zasio | 324/158 R |

Primary Examiner—Kenneth A. Wieder
Assistant Examiner—Vinh P. Nguyen
Attorney, Agent, or Firm—Jeffrey H. Ingerman

[57] ABSTRACT

Apparatus and a method for measuring average individual gate delays on integrated circuit wafers without the need for high bandwidth is provided. A chain of gates is provided on the wafer. A reference signal is propagated through the chain to produce a delayed signal. The delayed signal is logically combined with the reference signal to provide a periodic train of pulses whose period is proportional to that of the reference signal. The pulse widths represent the total gate delay of the chain, and are determined by statistically sampling the pulse train to determine its duty cycle. The apparatus and method are compatible with automated testing equipment and methods which can be synchronized with the reference signal.

12 Claims, 3 Drawing Sheets

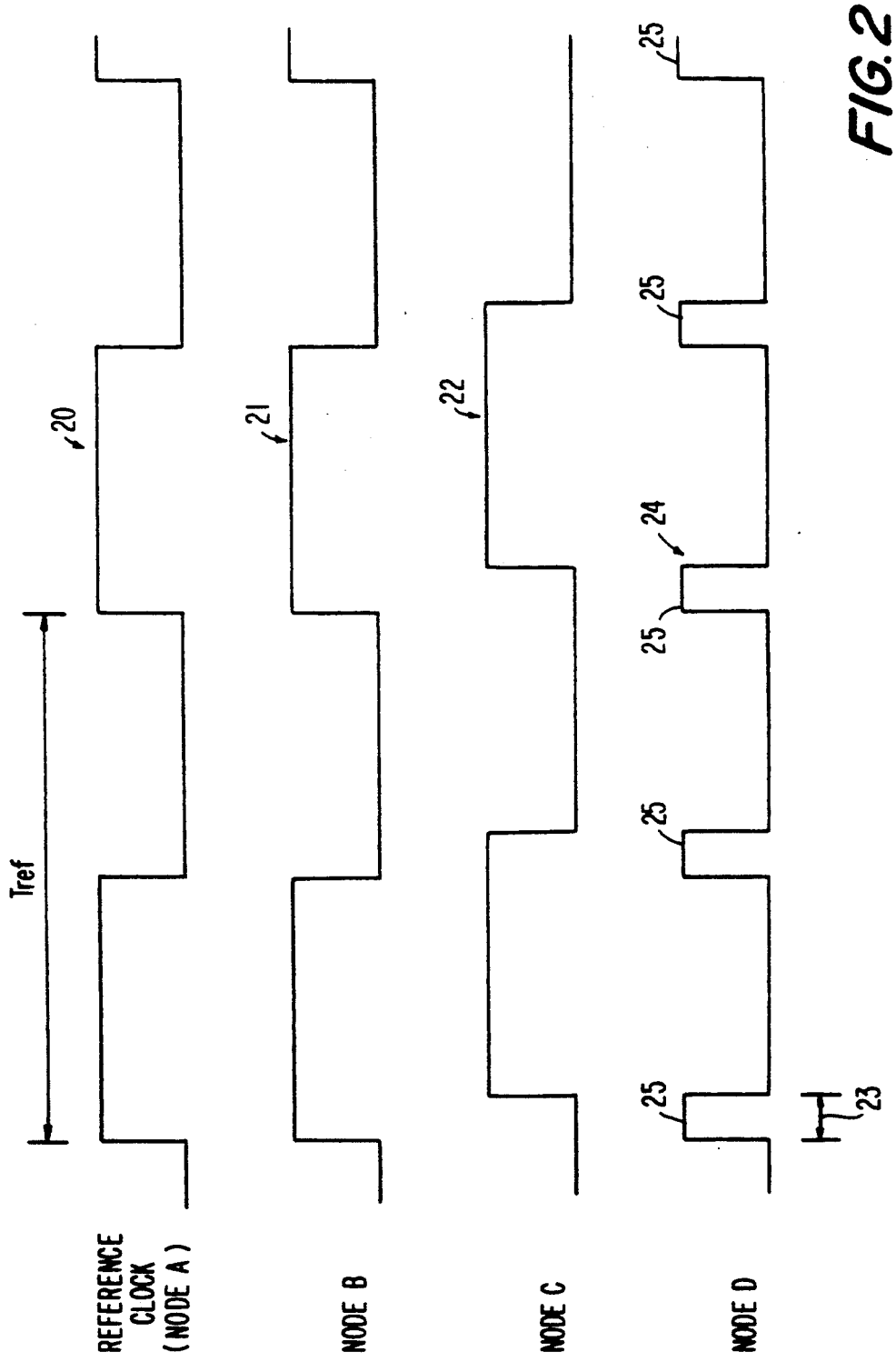

APPARATUS AND METHOD FOR MEASURING GATE DELAYS IN INTEGRATED CIRCUIT WAFERS

BACKGROUND OF THE INVENTION

This invention relates to the measurement of gate delays in integrated circuit wafers. More particularly, this invention relates to apparatus and a method for measuring the gate delay in an integrated circuit wafer, which apparatus does not need as wide a bandwidth as previously known testing apparatus.

Variations in the manufacturing process for integrated circuit wafers sometimes occur, giving rise to variations in wafer characteristic from batch to batch of wafers, or even from wafer to wafer within a given batch. It is important that these various characteristics all meet certain specifications, or at least that their values be known.

One such characteristic is the gate delay. A common method of measuring gate delay is to include a ring oscillator circuit on the wafer. This circuit is a chain of an odd number of inverters, with the output of the last inverter connected to the input of the first inverter. When the input of the first inverter is made high, the circuit begins to oscillate, with the output changing from high to low as a square wave, which can be observed by placing probes of an appropriate testing apparatus on appropriate pads of the wafer. The width of each high or low portion of the square wave is equal to the total delay of the circuit, which in turn is equal to the product of the number of inverters and the average individual delay of each inverter (the individual delay is approximately the same for each inverter on a given wafer). Thus the period of the square wave is equal to twice that product.

A typical gate delay is between about 0.2 nsec and 1.0 nsec. The number of inverters used in a typical ring oscillator circuit is usually 11, 13 or 29. Thus the period of the square wave can be as short as about 4.4 nsec. Accordingly, the testing apparatus must have a bandwidth of up to about 227 MHz to be able to resolve the square wave output of the ring oscillator.

In addition, test procedures using a ring oscillator are not compatible with automated testing equipment, because the ring oscillator is free-running, and therefore difficult to synchronize with the test equipment. Accordingly, a human operator must read the oscillation period from an oscilloscope and calculate the gate delay manually or, at best, enter the period into the automated testing equipment which then calculates the gate delay.

It would be desirable to be able to provide apparatus and a method for testing the gate delay in an integrated circuit wafer, the apparatus not needing a high bandwidth.

It would also be desirable to be able to provide such apparatus and method which are compatible with automated testing equipment and methods.

SUMMARY OF THE INVENTION

It is an object of this invention to provide apparatus and a method for testing the gate delay in an integrated circuit wafer, the apparatus not needing a high bandwidth.

It is also an object of this invention to provide such apparatus and method which are compatible with automated testing equipment and methods.

In accordance with this invention, there is provided apparatus for measuring gate delays in an integrated circuit wafer. The apparatus comprises a chain of logical elements on the wafer, the chain comprising a number of logical elements connected in cascade fashion, each of the logical elements having an elemental input and an elemental output. A first logical element in the chain has a chain input and a last logical element in the chain has a chain output. Each of the logical elements has an elemental gate delay, and the chain has a total gate delay. The apparatus also includes means for generating a reference clock signal having a reference period longer than twice the total gate delay, and means for applying the reference clock signal to the chain input. A gate means has a first gate input, a second gate input and a gate output, and the chain output is applied to the first gate input. The reference clock signal is applied also the said second gate input, such that the gate output is a train of periodic pulses having a pulse width proportional to the total gate delay and a period proportional to the reference period. Means is provided for repeatedly sampling the gate output to determine a duty cycle of the gate output, and for calculating the elemental gate delay from the number of gates, the pulse width, the reference period, and the duty cycle.

A method of measuring the elemental gate delay is also provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 2 is a graphic representation of some of the signals present in the apparatus of FIG. 1.

DETAILED DESCRIPTION OF THE INVENTION

The present invention measures the gate delay in a wafer by generating a reference signal, preferably in the form of a square wave. The reference signal is passed through a chain of gates or other logical elements on the wafer which are provided at least in part for this purpose, thereby delaying the signal. In the preferred embodiment, this is done by passing the reference signal through a chain of an even number of inverters, so that the delayed signal has the same sense as the original reference signal. Other chains of gates or other logical elements can also be used, however. One such alternative is a chain of two-input AND gates with one input of two-input each gate held high and the other input connected to the output of the previous AND gate. Another alternative is a chain of two-input XOR gates similarly connected. Multiple-input AND or XOR gates could also be used, with some portion of the inputs all held high and another portion all connected to the output of the previous AND or XOR gate, which for purposes of this invention is the same as using two-input gates as described above. Other alternatives might also be possible.

The delayed reference signal is identical to the original reference signal except for phase. In the case of a square wave reference signal, the two square waves would have identical periods and amplitudes, but will be out of phase by a time interval equal to the total delay of all gates in the chain. If the length of the delay can be measured, it can be divided by the number of gates in the chain to yield the average delay of an individual gate. The manner in which this can be done is best explained in the context of the preferred embodiment, as depicted in FIG. 1, and the resulting signal waveforms depicted in FIG. 2, it being understood that it may be possible to practice the present invention using other embodiments.

Figure 1:
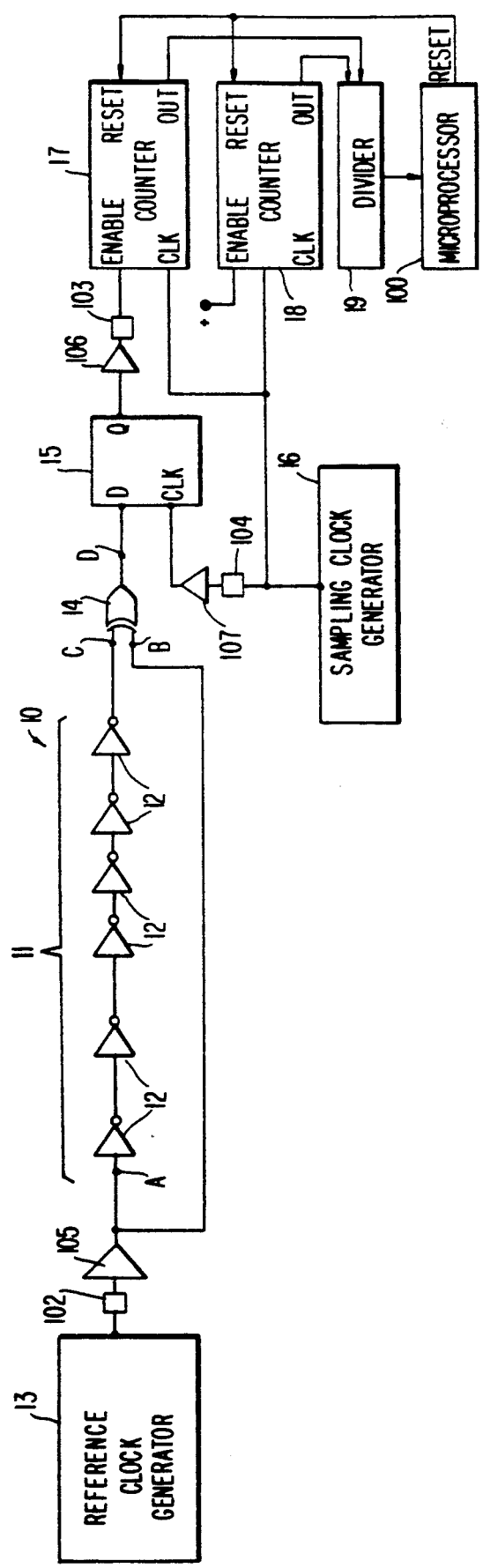
FIG. 1 is a schematic diagram of a first preferred embodiment, of apparatus in accordance with the present invention.

As shown in FIG. 1, testing apparatus 10 includes a chain 11 of inverters 12, although, as discussed above, a chain of other types of gates might also be used. In the embodiment shown, chain 11 includes six inverters 12 for ease of illustration, although any even number can be used, as discussed above. In a particularly preferred embodiment (not shown), the actual number of inverters would be between about ten and about twenty.

A reference clock generator 13 generates a reference clock signal which is input to chain 11 and to one input of an XOR gate 14. The delayed reference signal at the output of chain 11 is the other input of XOR gate 14. The output of XOR gate 14 is input to the D input of a D-type flip-flop 15. A sampling clock generator 16 generates a sampling clock signal which is input to the clock inputs of flip-flop 15 and counters 17, 18. The Q output of flip-flop 15 is the enable input of counter 17. The enable input of counter 18 is held high. The outputs of counters 17, 18 are input to a divider 19, the output of which is input to a microprocessor 100.

Flip-flop 15, counters 17, 18, divider 19 and microprocessor 100 together calculate the duty cycle of the signal output by XOR gate 14, and from that duty cycle calculate the average gate delay of the wafer in question, as discussed in more detail below.

The components of testing apparatus 10 need not be, and in the preferred embodiment are not, all located on the wafer to be tested. The only components that absolutely must be on the wafer are inverters 12. Preferably, in addition to inverters 12, XOR gate 14 and flip-flop 15 are also on the wafer to prevent unpredictable delays caused by the lengths of the hookups from adding to the total delay time and distorting the measured average gate delay. The remainder of testing apparatus 10 is located in a separate testing device having probes (not shown) to connect to pads symbolically shown at 102, 103, 104 which are buffered by buffers 105, 106, 107 to isolate chain 11, XOR gate 14 and flip-flop 15 from external loading, thereby ensuring clean, sharp edges on the test signals. Any hookup delays in the input reference and sampling clocks 13, 16 are unimportant, because reference clock 13 is free-running in any event and it is not important when the samples are taken. Hookup delay in detecting the flip-flop output is also relatively unimportant as long as the sampling clock pulse width exceeds the hook-up delay.

Keeping as much of testing apparatus 10 as possible off the wafer saves space on the wafer for the components for which the wafer is actually being made, and also allows for reuse of most of the testing circuit, rather than needless duplication of testing components. In addition, testing apparatus 10 according to the invention having ten inverters 12 in chain 11 occupies approximately the same wafer area as a 29-stage ring oscillator. However, a ring oscillator requires a bandwidth of $\frac{1}{2}nt$, where n is the number of inverters and t is the average gate delay. Assuming an average gate delay of 0.2 nsec, the required bandwidth is about 86 MHz. In contrast, with apparatus 10 according to the present invention, assuming a reference clock of 10 MHz, taking 1000 samples would resolve the total delay to within about 0.1 nsec, as explained in more detail below. Thus using the same area of the wafer allows a bandwidth of only 10 MHz as opposed to 86 MHz. To achieve the same bandwidth (i.e., 10 MHz) with a ring oscillator would require 8.6 times the wafer area.

Figure 1A:
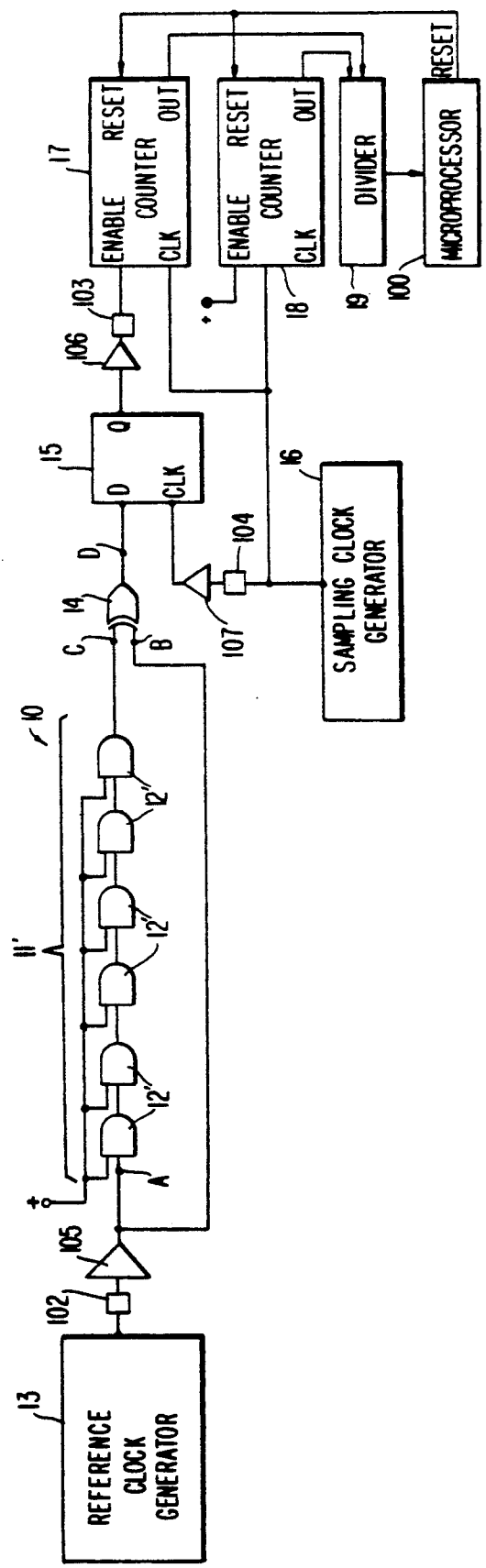
FIG. 1A is a schematic diagram of a second preferred embodiment of apparatus in accordance with the present invention.

As stated above, instead of being implemented using chain 11 of inverters 12, the present invention could be implemented using a chain 11' of the two-input AND gates 12', as shown in FIG. 1A. In such an arrangement, one input of each of AND gates 12' is held high and the other input of each of AND gates 12' is connected to the output of the previous AND gate 12', except of course for the first AND gate 12' in chain 11' whose other input receives the input reference clock signal.

The signals used in the preferred embodiment to measure the gate delay are shown graphically in FIG. 2. Reference clock signal 20, in the form of a square wave with period $T_{ref}$, is produced by reference clock generator 13 and is present at node A, the input to the first of inverters 12 in chain 11. Signal 21, present at node B, one of the inputs to XOR gate 14, is identical to reference clock signal 20. Signal 22, present at node C, the other input to XOR gate 14, is the delayed signal resulting from the propagation of signal 20 through chain 11, and is identical to signal 20 except that it is phase-shifted in time by the total delay of chain 11, shown at 23. Delay 23 can be represented as the product of the number of inverters, 2n (any even number), and t, the average individual gate delay on the wafer being tested, which is the quantity that is to be measured. Delay 23 can thus be expressed as 2nt. $T_{ref}$ should be greater than twice the total gate delay 2nt, so that at least one total gate delay can be observed during a reference period.

To measure delay 23 in the preferred embodiment, signals 21, 22 are logically combined in such a way that the combined signal is high when one but not the other of the original and delayed reference signals is high, and low when both the original and delayed reference signals are either high or low. Thus each time interval during which the combined signal is high represents the total delay 23. Such a logical combination preferably is achieved by inputting both signals 21, 22 into XOR gate 14, but other logical functions may also yield a combined signal from which delay 23 can be easily derived.

Because in the preferred embodiment XOR gate 14 is used to produce combined signal 24, present at node D, combined signal 24 takes the form of a periodic train of pulses 25, each having a pulse width equal to delay period 23. Each pulse 25 occurs on both the rising edge of original reference clock signal 20/21, because at that point signal 20/21 is high but delayed signal 22 is still low, and on the falling edge of signal 20/21, because at that point signal 20/21 is low but signal 22 is still high. The period of signal 24 is thus half that of signals 20, 21 and 22, and can be expressed as $T_{ref}/2$.

While delay 23 can be measured directly from signal 24 by measuring the duration of any particular pulse 25, apparatus capable of making such a measurement would suffer from the same bandwidth constraints as apparatus for measuring the same quantity from a ring oscillator as discussed above, because a Fourier analysis of a square pulse of width 2nt would yield frequency components on the order of ½nt, even though the pulses occur only once in $T_{ref}/2$.

Instead, according to the present invention, delay 23 is determined by statistically sampling signal 24 to determine its duty cycle —i.e., the percentage of the time that signal 24 is high. It is apparent from the graphical representation of signal 24 in FIG. 2 that the following relationship holds:

$$2nt = (T_{ref}/2) \cdot \text{Duty-Cycle}. \quad (1)$$

The average individual gate delay t, then, can be computed directly as follows:

$$t = (T_{ref} \cdot \text{Duty-Cycle})/4n. \quad (2)$$

It is thus possible in accordance with the present invention to measure the average individual gate delay t of a wafer using apparatus having bandwidth requirements determined by $T_{ref}$, rather than by t. As $T_{ref}$ can be made as long as desired, the bandwidth can be kept as small as desired, although the longer $T_{ref}$ is made, the more samples are needed —i.e., the higher the sampling frequency must be to obtain a satisfactory resolution or confidence level in the result, as discussed in more detail below.

The sampling frequency is determined by sampling clock generator 16 having a sampling period $T_{sample}$. Counter 18 is incremented once every sampling period $T_{sample}$. Counter 17 is incremented only when signal 24, as output from flip-flop 15, is high during a sampling interval, as determined by sampling clock 16 which is the clock input of counter 17. Thus the ratio of the counts in counters 17, 18, as determined by divider 19, is equal to the duty cycle of signal 24, assuming that the correct sampling period $T_{sample}$ is chosen, as discussed below.

The duty cycle determined by divider 19 is input to microprocessor 100, which is programmed to solve Equation (2), above, for t. Microprocessor 100 may instead find t using a look-up table (not shown) in which various values of t corresponding to values of the duty cycle are stored. Similarly, divider 19 would be omitted and the outputs of counters 17, 18 could be input directly into microprocessor 100, which could be programmed to perform the division necessary to determine the duty cycle.

The choice of the sampling period $T_{sample}$ should be made so as to maximize the resolution, or confidence, of the value obtained for the duty cycle. One absolute constraint is that $T_{sample}$ cannot equal any integer multiple of $T_{ref}/2$, to prevent the duty cycle from either always being 1 or always being 0. One possibility is to have $T_{sample}$ be much smaller than $T_{ref}/2$, taking many samples during a single period $T_{ref}/2$. However, this reintroduces the need for sampling apparatus having a bandwidth greater than $2T_{ref}$, eliminating one of the advantages of the present invention. Therefore, it is preferred than $T_{sample}$ be greater than $T_{ref}/2$, and that a large number of samples — e.g., one thousand samples — be taken. Typically, $T_{ref}$ would be about 100 nsec, and $T_{sample}$ could be any period greater than $T_{ref}/2$, subject to the absolute constraint referred to above. For example, if $T_{sample}$ were 100.1 nsec, the time necessary to take one thousand samples would be only about 100.1 μsec. In any event, the larger the number of samples, the better is the resolution of, or confidence level in, the result, as one could expect the ratio of high samples to low samples to converge on the actual duty cycle.

The resolution of the gate delay can be approximated as the ratio of $T_{ref}$ to the number of samples. Thus in the example discussed above using a reference clock of 10 MHz, $T_{ref} = 100$ nsec. Therefore the resolution if 1000 samples are taken is 100 nsec/1000 = 0.1 nsec.

Thus it can be seen that apparatus and a method for testing the average gate delay in an integrated circuit wafer, the apparatus not needing a high bandwidth, is provided. The apparatus and method also are compatible with automated testing equipment and methods, because the automated equipment can be synchronized with the reference signal, eliminating the need for a human operator to read an oscilloscope. One skilled in the art will appreciate that the present invention can be practiced by other than the described embodiments, which are presented for purposes of illustration and not of limitation, and the present invention is limited only by the claims which follow.

What is claimed is:

1. Apparatus for measuring gate delays in an integrated circuit wafer, said apparatus comprising:
   a chain of logical elements on said wafer, said chain comprising a number of said logical elements connected in cascade fashion, each of said logical elements having an elemental input and an elemental output, the elemental input of a first logical element in said chain being a chain input and the elemental output of a last logical element in said chain being a chain output, each of said logical elements having an elemental gate delay, and said chain having a total gate delay;
   means for generating a reference clock signal having a reference period longer than twice said total gate delay;
   means for applying said reference clock signal to said chain input;
   gate means having a first gate input, a second gate input and a gate output, said chain output being applied to said first gate input, said reference clock signal being applied also to said second gate input, such that said gate output is a train of periodic pulses having a pulse width proportional to said total gate delay and a period proportional to said reference period;
   means for repeatedly sampling said gate output to determine a duty cycle of said gate output; and
   means for calculating said elemental gate delay from said number, said pulse width, said reference period, and said duty cycle.

2. The apparatus of claim 1 wherein said logical elements are inverters and said number is even.

3. The apparatus of claim 1 wherein said logical elements are AND gates, each of said AND gates having two effective inputs, one of said effective inputs being held high, and the other of said effective inputs being said elemental input.

4. The apparatus of claim 1 wherein said gate means is an XOR gate.

5. The apparatus of claim 1 wherein said means for repeatedly sampling said gate output samples said gate output at regular intervals separated by a sampling period.

6. The apparatus of claim 5 wherein said sampling period is greater than one half said reference period.

7. The apparatus of claim 1 wherein said means for repeatedly sampling said gate output samples said gate output at random intervals.

8. The apparatus of claim 1 wherein said means for sampling said gate output comprises:
   a D-type flip-flop having a D input, a clock input and a Q output;
   means for generating a sampling clock signal; and
   means for applying said sampling clock signal to said flip-flop clock input; wherein:
   said chain output is connected to said D input; and
   said Q output reflects said chain output on each rising edge of said sampling clock signal.

9. The apparatus of claim 8 wherein said means for sampling said gate output further comprises:
   first and second counter means;
   means for determining when said Q output and said clock input are high simultaneously and for incrementing said first counter means when said Q output and said flip-flop clock input are simultaneously high;
   means for incrementing said second counter means when said flip-flop clock input is high; and
   means for dividing the contents of said first counter means by the contents of said second counter means to determine said duty cycle.

10. The apparatus of claim 9 wherein said means for determining when said Q output and said clock input are simultaneously high comprises an enable input on said first counter means connected to said Q output and a clock input on said first counter means connected to said sampling clock.

11. The apparatus of claim 1 wherein said means for calculating said elemental gate delay calculates said elemental gate delay by determining a product of one-half said reference period and said duty cycle and dividing said product by twice said number.

12. A method for measuring gate delays in an integrated circuit wafer, said method comprising the steps of:
   generating a delayed signal by inputting a reference signal having a reference period into a chain of a known number of gates on said wafer, each gate in said chain having an elemental gate delay and said chain having a total gate delay;
   logically combining said delayed signal with said reference signal to produce a combined signal in the form of a train of periodic pulses having a pulse width proportional to said total gate delay and a period proportional to said reference period;
   repeatedly sampling said combined signal to determine a duty cycle thereof; and
   calculating said elemental gate delay from said member, said pulse width, said reference period, and said duty cycle.

* * * * *